(12) United States Patent
Schaller et al.

(10) Patent No.: US 8,777,284 B2
(45) Date of Patent: Jul. 15, 2014

(54) VENTURI ASSISTED GRIPPER

(75) Inventors: Jason Schaller, Austin, TX (US); Robert Brent Vopat, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/451,598

(22) Filed: Apr. 20, 2012

(65) Prior Publication Data
US 2013/0277999 A1  Oct. 24, 2013

(51) Int. Cl.
*A47J 45/00* (2006.01)

(52) U.S. Cl.
USPC ............... 294/64.2; 294/185; 294/186

(58) Field of Classification Search
USPC ........... 294/183, 64.2, 186, 188, 65, 185, 907
See application file for complete search history.

(56) References Cited

U.S. PATENT DOCUMENTS

| | | | |
|---|---|---|---|
| 5,636,887 A * | 6/1997 | Petropoulos et al. | 294/64.2 |
| 5,928,537 A | 7/1999 | Fortune | |
| 6,397,876 B1 * | 6/2002 | Golden et al. | 137/14 |
| 7,222,901 B2 * | 5/2007 | Gebauer et al. | 294/183 |
| 2008/0179224 A1 | 7/2008 | Van Bossuyt | |
| 2010/0296903 A1 | 11/2010 | Shah et al. | |

FOREIGN PATENT DOCUMENTS

| | | |
|---|---|---|
| EP | 1676794 A1 | 7/2006 |
| EP | 2105393 A1 | 9/2009 |
| WO | 2010094343 A1 | 8/2010 |

OTHER PUBLICATIONS

International Search Report and Written Opinion, mailed Jun. 13, 2013, PCT/US2013/036307 dated Apr. 12, 2013.

* cited by examiner

*Primary Examiner* — Stephen Vu

(57) ABSTRACT

A gripper system which utilizes two different suction systems is disclosed. This gripper system utilizes one suction system to pick up an item, while using the second suction system to hold the item. In some embodiments, a Venturi device based suction system is used as the first suction system to pick up the item, as this type of system is proficient at picking up items without requiring initial contact to create a seal. In some embodiments, a vacuum based system is used as the second suction system, as this type of system is able to hold items cost effectively.

18 Claims, 10 Drawing Sheets

VENTURI ASSISTED GRIPPER

BACKGROUND

Many applications require the use of robotic arms or other means to pick up an item, hold that item, and move it to another location. For example, in semiconductor or solar cell manufacturing, it is common to use a gripper to pick up one or more wafers, and move those wafers to another location. For example, unprocessed wafers may arrive at a site in a carrier. These unprocessed wafers must be transferred to another carrier or holder so that they may be processed. After being processed, these wafers must again be picked up and moved to a carrier for processed wafers.

There are various techniques currently used to pick up and hold items. FIG. 1 shows a typical suction system 10 utilizing a Venturi device 40. Compressed Dry Air (CDA) arrives from a source 20. When gating element 30, which may be a valve, is actuated, CDA rushes from the source 20, passing through the Venturi device 40 and exiting through the muffler 50 into the environment. Note that muffler 50 is optional in all Venturi device based embodiments shown in this disclosure. The Venturi device 40 creates negative pressure in conduit 60, which forces air into the suction system, thereby evacuating the cavity 70 in communication with the conduit 60. These suction systems 10 generate a great amount of negative pressure, and are therefore effective for picking up items 90 located below gripper 80. However, while these suction systems 10 excel at picking up items 90, they require a continuously flow of CDA in order to retain the item 90 once picked up. In some instances, a single gripper 80 may require 4 cubic feet per minute (CFM) of CDA to pick up and retain an item 90. Therefore, for large systems, or those with very high utilization, the amount of CDA used may be excessive and cost prohibitive.

FIG. 2 shows a typical suction system 100 utilizing vacuum. In this system, a negative pressure source 110 is used. A gating element 120, such as a valve, is used to actuate this system. When the gating element 120 is in a first position, the negative pressure source 110 is in communication with the cavity 130, thereby creating negative pressure in the gripper 140. If an item 90 is placed at or near this gripper 140, the suction system 100 can retain the item 90. However, due to the low differential pressure, vacuum systems may not be ideal in picking up items, such as semiconductor wafers, without initial contact. However, vacuum systems are relatively cost effective, in comparison to the Venturi device based suction system 10 described in FIG. 1.

When the gating element 120 is in a second position, the negative pressure source 110 is disconnected from the gripper 140, thereby releasing the item 90. In some embodiments, a source of CDA 150 is provided in series with a second gating element 160, which also may be a valve. When the gating element 120 is turned to the second position, the second gating element 160 may be opened. This supplies CDA to the gripper 140, which forces the item 90 away from the gripper 140.

In some embodiments, there may be a requirement to pick up (without initial contact), hold and place a large number of items. One such embodiment may be a semiconductor or solar cell manufacturing process. The use of vacuum systems is cost effective, but is not optimal in picking up a large number of items. Venturi device based suction systems are very proficient at picking up items quickly and effectively without initial contact for a seal to be formed, but may be cost prohibitive at a large scale due to the amount of CDA needed.

Thus, it would be beneficial if a suction system existed which was cost effective and had the ability to pick up items quickly without initial contact. Furthermore, it would be beneficial if there were a large scale system capable of picking up, holding and placing large numbers of items in a relatively short period of time.

SUMMARY

A gripper system which utilizes two different suction systems is disclosed. This gripper system utilizes one suction system to pick up an item, while using the second suction system to hold the item. In some embodiments, a Venturi device based suction system is used as the first suction system to pick up the item, as this type of system is proficient at picking up items without requiring initial contact to create a seal. In some embodiments, a vacuum based system is used as the second suction system, as this type of system is able to hold items cost effectively.

BRIEF DESCRIPTION OF THE DRAWINGS

For a better understanding of the present disclosure, reference is made to the accompanying drawings, in which like elements are referenced with like numerals, and in which.

DETAILED DESCRIPTION

As stated above, vacuum systems are proficient at holding items, but may not excel at initially picking up an item, especially without initial contact to create a seal. Venturi device based suction systems are proficient at picking up items and holding them, but require a high amount of compressed dry air, especially if holding an item for extended periods of time. Therefore, an ideal gripper system may utilize both types of suction systems, utilizing each for the function that it performs best.

Figure 1:
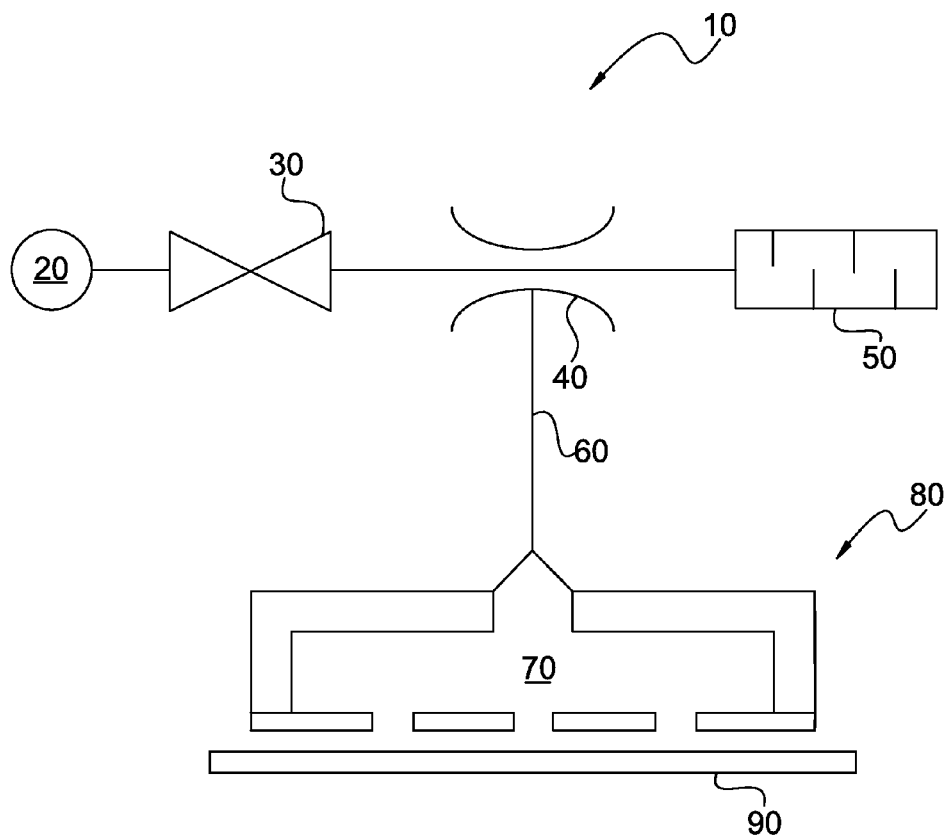
FIG. 1 is a block diagram of a Venturi device based gripper system.
Figure 2:
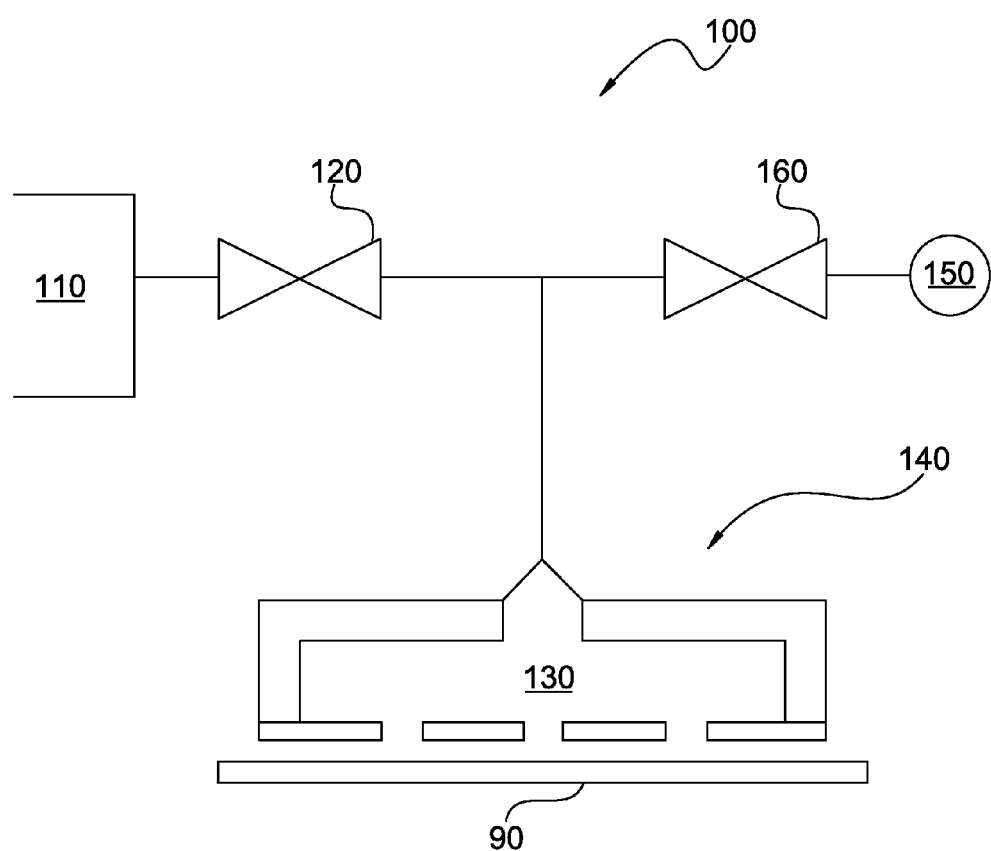
FIG. 2 is a block diagram of a vacuum based gripper system.
Figure 3:
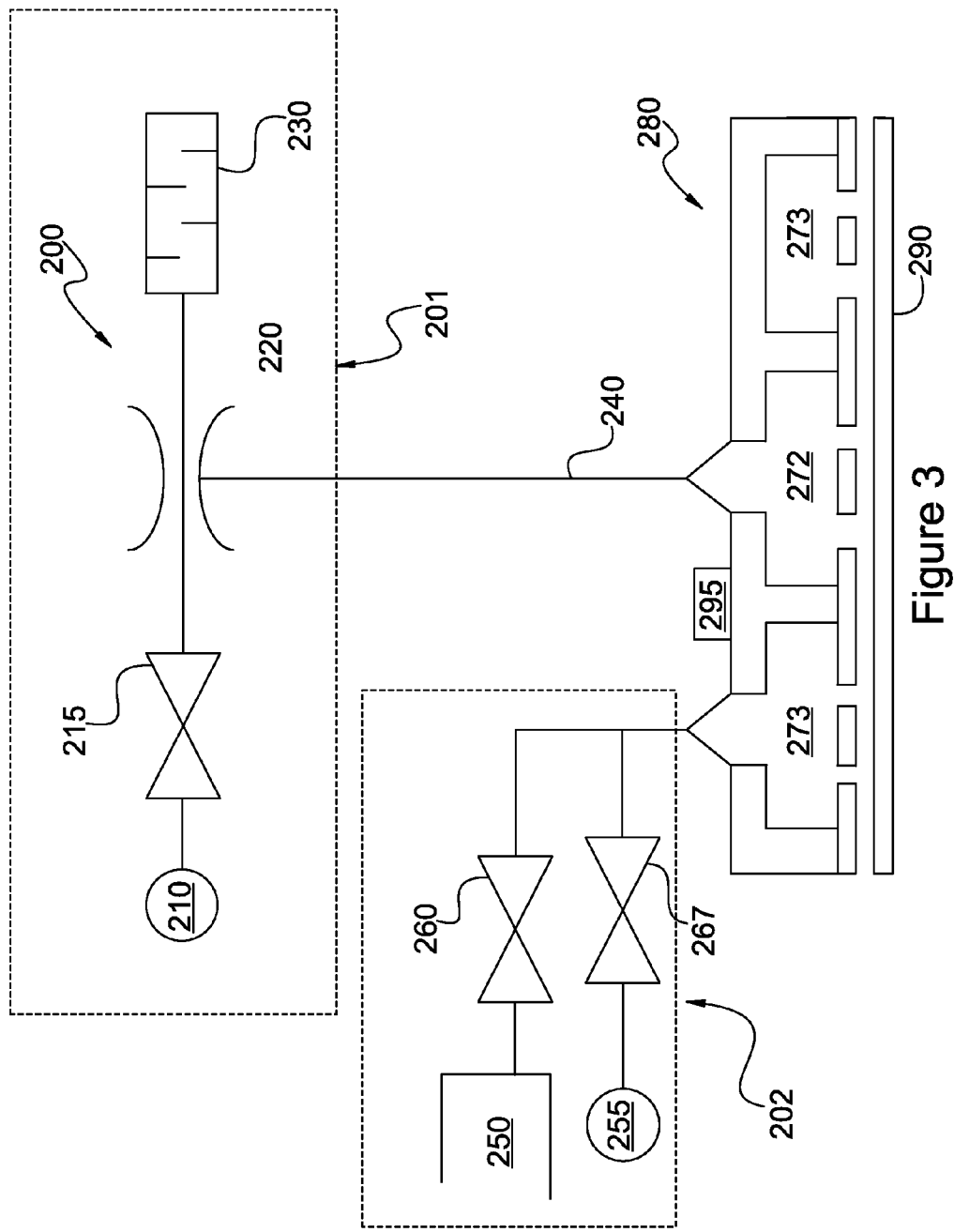
FIG. 3 is a block diagram of a gripper system according to a first embodiment.

FIG. 3 shows a first embodiment of a gripper system 200. In this embodiment, the gripper 280 comprises at least two cavities, 272, 273 which are separated from each other. One of these cavities 272 is in communication with a first suction system 201, while the second cavity 273 is in communication with a second suction system 202. In some embodiments, the first and second suction systems 201, 202 are different types of systems. For example, the second suction system 202 may employ vacuum, while the first suction system 201 may employ a Venturi device. In this embodiment, the first suction system 201 is a Venturi device based system, having a source of CDA 210, a gating element 215, a Venturi device 220, a muffler 230 and a conduit 240. The proximate end of the conduit 240 is in communication with the Venturi device 230, while the distal end is in communication with cavity 272 of the gripper 280.

The second suction system 202 includes a source of negative pressure 250, and a gating element 260. Optionally, a source of CDA 255 and an associated gating element 267 may also be included in the second suction system 202. This second suction system 202 is in communication with cavity 273 of gripper 280. All of these gating elements may be valves.

Figure 4:
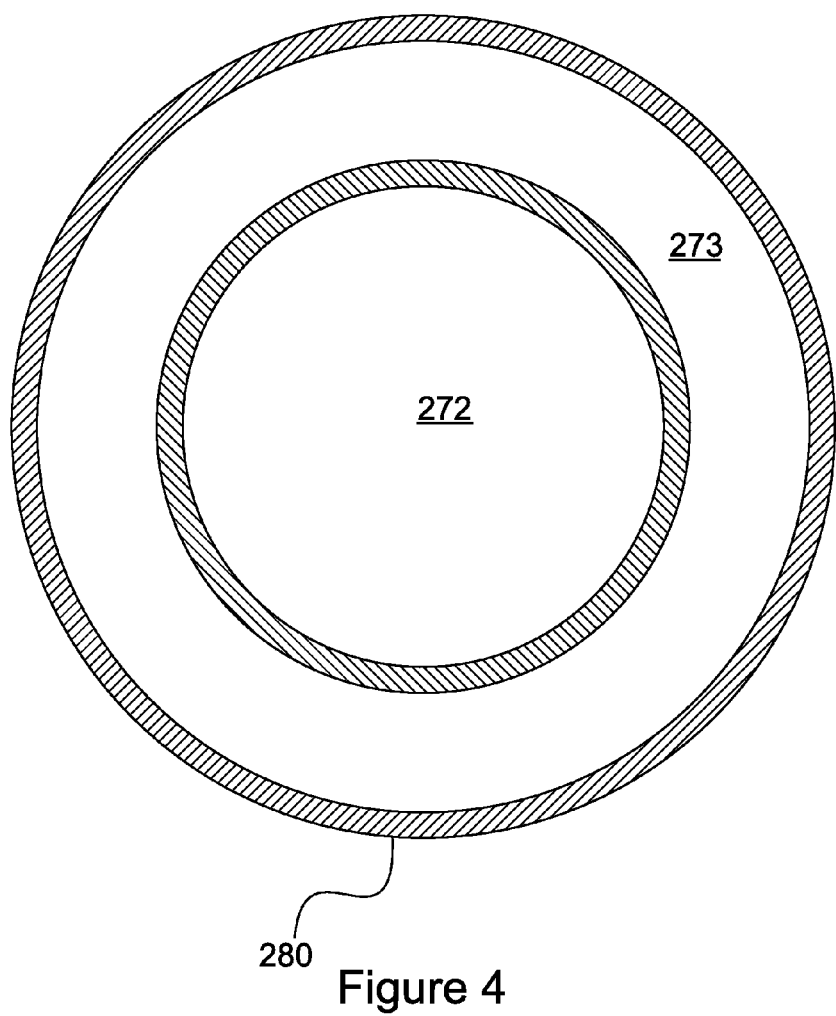
FIG. 4 shows the bottom view of the gripper of FIG. 3.

FIG. 4 shows a bottom view of the gripper 280. In this embodiment, the cavities 272, 273 re arranged concentrically, such that cavity 272 occupies the center of the gripper 280, while the cavity 273 is arranged on the outside of the cavity 272. Other configurations or shapes are also possible. For example, the gripper 280 may have a larger number of concentric rings, where alternating rings are in communication with a particular suction system. In other embodiments, rings are not used. For example, the bottom of the gripper 280 may be divided into a grid having a plurality of cavities arranged into rows and columns. This plurality of cavities may be configured such that adjacent cavities are in communication with different suction systems. Other designs are possible.

In operation, the first suction system 201 is enabled by opening gating element 215, thereby allowing compressed air to flow through the gating element 215, the Venturi device 220 and the muffler 230. This flow creates negative pressure in the conduit 240 attached to the Venturi device 220, thereby creating suction in cavity 272 of the gripper 180. This suction causes the gripper 280 to pick up the item 290, such as a semiconductor wafer or solar cell. Note that the suction created by only a portion of the cavities 272, 273 is sufficient to lift the item 290. Various techniques may be used to determine whether the item 290 has been picked up. For example, the first suction system 201 may be enabled for a predetermined period of time, and this time is known to be adequate to insure that the item 290 is picked up. In other embodiments, a sensor, such as a proximity sensor 295, may be used to determine that the item 290 is picked up.

Once the item 290 has been picked up, the second suction system 202 may enabled, by opening gating element 260. This action serves to create suction in the other cavity 273 in the gripper 280.

When sufficient time has elapsed to insure that the second suction system 202 has exhausted the air from the cavity 273, the first suction system 201 may be disabled by closing gating element 215. Thus, the item 290 is retained on the gripper 280 through suction created only in the cavities in communication with the second suction system 202.

When the item is to be placed, the gating element 260 is closed, thereby removing the source of negative pressure from the cavity 273. If desired, a source of CDA 255 may be used to force the item 290 to blow off the gripper 280. This source of CDA is in communication with cavity 273 via gating element 267.

Although not shown, the sequencing of the gating elements, or valves, may be performed through the use of a controller. This controller may control the gating elements and also be in communication with sensor 295 to determine when the item 290 has been picked up so as to know when to transition from the first suction system 201 to the second suction system 202.

Figure 5:
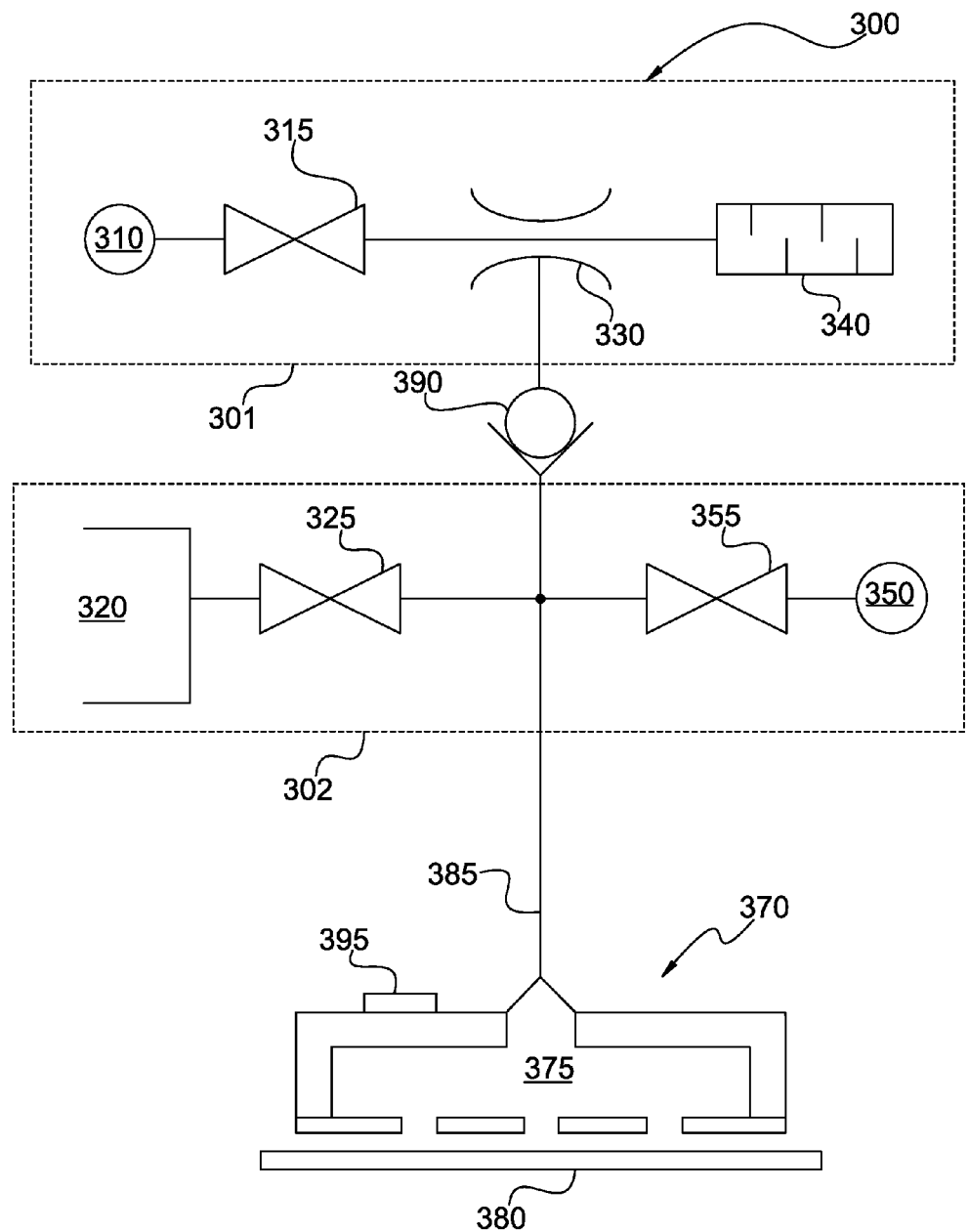
FIG. 5 is a block diagram of a gripper system according to a second embodiment.

FIG. 5 shows a second embodiment of the gripper system 300. Unlike the first embodiment, the gripper 370 has a single cavity 375 in this configuration, which two different suction systems 301, 302 are in communication with. In this embodiment, the first suction system 301, which may include a Venturi device 330, is in communication with the gripper 370 via a conduit 385, which includes a check valve 390 or other similar device which allows air to flow only in one direction. As described above, the Venturi device based system 301 includes a CDA source 310, and a gating element 315 to allow the flow of compressed air through the Venturi device 330 and out through the muffler 340. The proximal end of the conduit 385 is in communication with the Venturi device 330 while the distal end of the conduit 385 is in communication with a cavity 375 of gripper 370. That cavity 375 is in communication with the second suction system 302, which includes a negative pressure source 320 and a gating element 325. Optionally a second source of CDA 350 and a gating element 355 may be included to allow the compressed air to be used to force the item 380 to be blown off the gripper 370. Again, all the gating elements may be valves.

In operation, at startup, the second suction system 302, which may be a vacuum system, is disabled by closing gating element 325. The first suction system 301 is enabled by opening gating element 315, allowing the flow of air up through the gating element 315, the Venturi device 330 and the muffler 340. As described above, this air flow creates negative pressure in conduit 385, which forces air up from the cavity 375 and through the conduit 385. As the flow is upward, the check valve 390 does not inhibit the flow of air. When the air is evacuated from the cavity 375, the gripper 370 will pick up the item 380. Once the item 380 has been picked up, as determined based on elapsed time or a sensor 395, such as a proximity sensor, the second suction system 302 is enabled by opening gating element 325. At this point, or slightly thereafter, the first suction system 301 is disabled by closing gating element 315. Since the first suction system 301, when disabled, is in communication with the environment through muffler 340, it is necessary to block the flow of air going from the first suction system 301 through the conduit 385 and to the negative pressure source 320. Thus, in this mode, the check valve 390 moves to its operative position, where it blocks the flow of air from the first suction system 301 to the cavity 375 and to the negative pressure source 320. The second suction system 302 is then used to hold the item 380. When it is desired to place the item 380, the gating element 325 is closed, disconnecting the negative pressure source 320 from the gripper 370. If desired, a second source of CDA 350 may be included, which is in communication with the gripper 370 via gating element 355. When the item 380 is to be placed, gating element 355 may be opened, thereby allowing compressed air to flow into the cavity 375, thereby pushing the item 380 off the gripper 370.

Although not shown, as described above, the sequencing of the gating elements, or valves, may be performed through the use of a controller. This controller may control the gating elements and also be in communication with sensor 295 to determine when the item has been picked up so as to know when to transition from the first suction system 301 to the second suction system 302.

FIGS. 3 and 5 shows two possible embodiments where a first suction system and a second suction system are in communication with a single gripper. This configuration allows one suction system to be primarily responsible for picking up the item, while the other suction system is used to hold the item. In some embodiments, the first suction system is a Venturi device based system, while the second suction system is a vacuum system. Although two configurations are shown, other configurations in which two suction system are in communication with a single gripper are also within the scope of the disclosure.

Figure 6A:
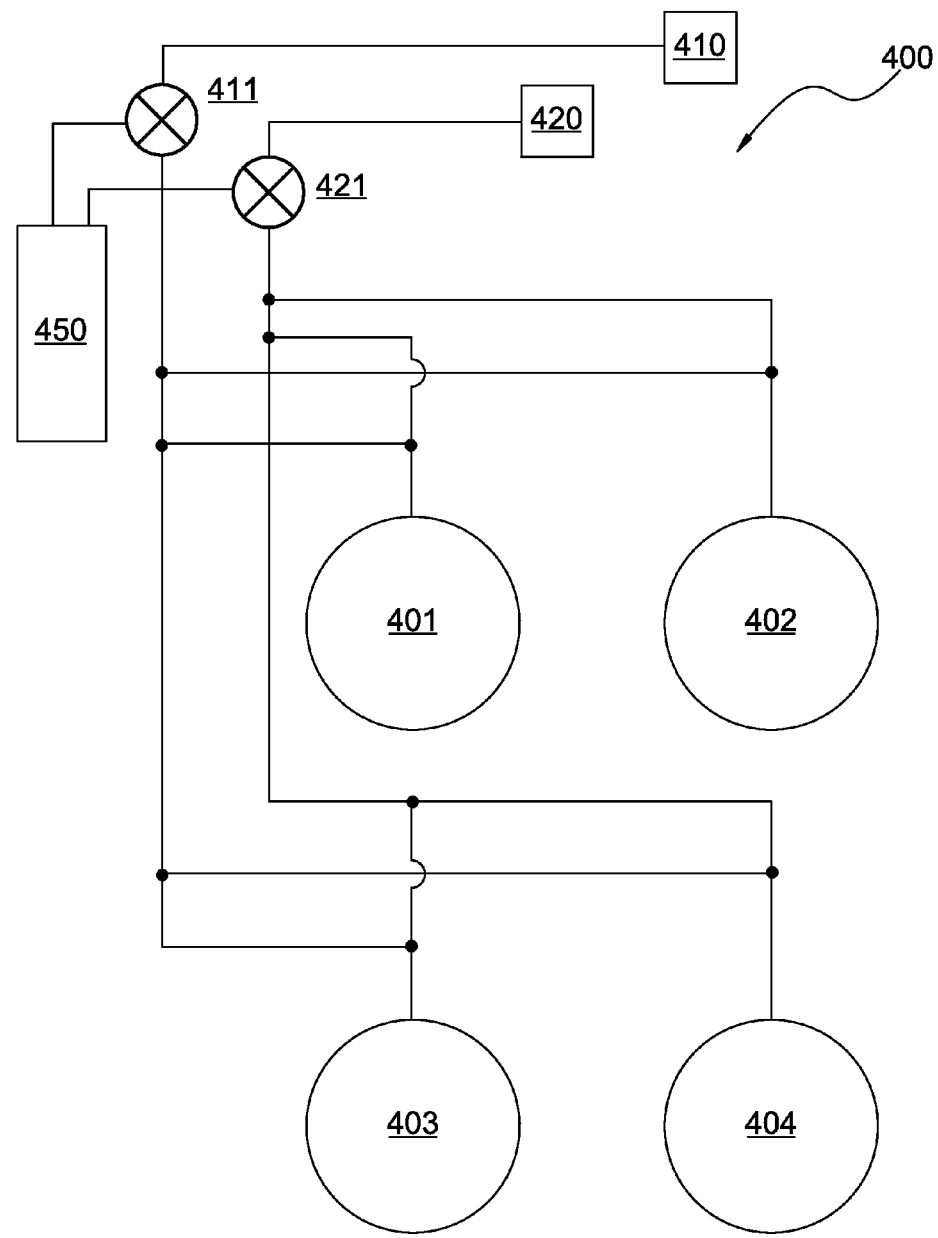
FIG. 6A shows a gripper system using an array of grippers according to one embodiment.
Figure 6B:
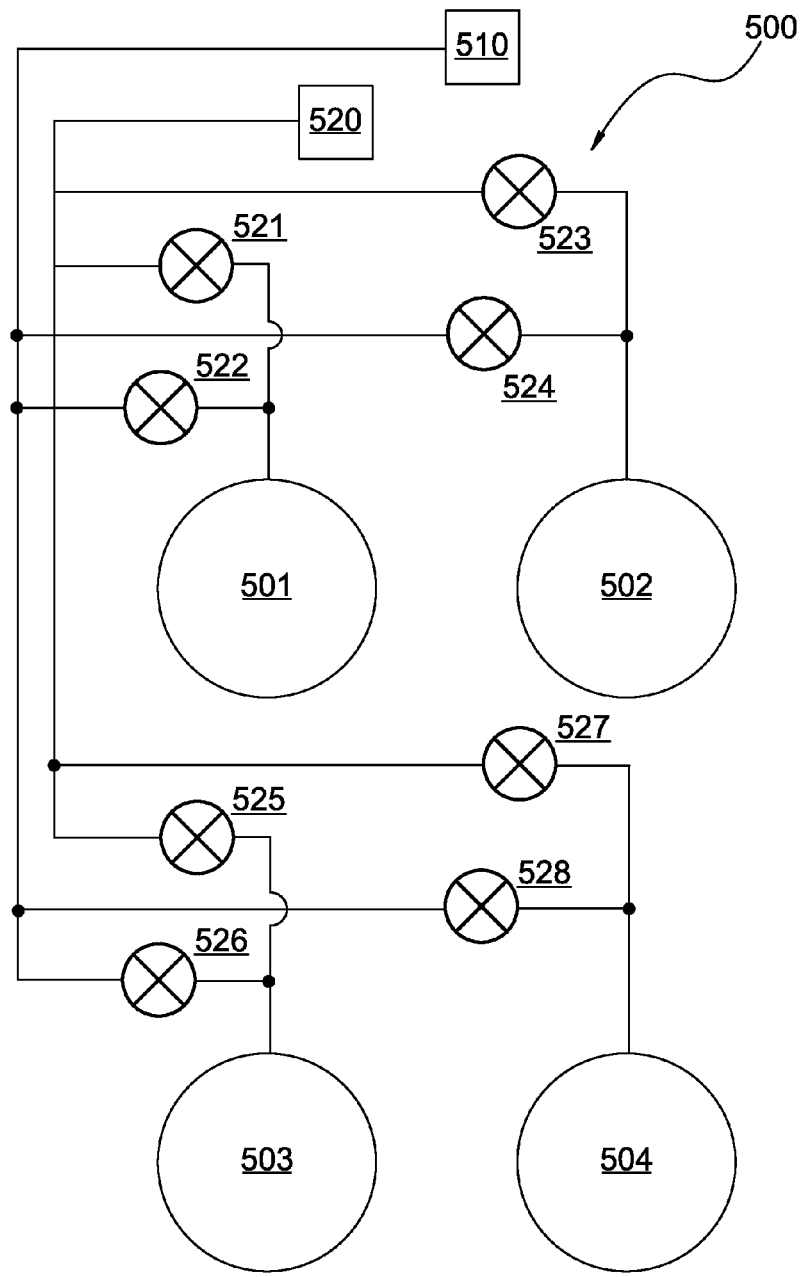
FIG. 6B shows a gripper system using an array of grippers according to another embodiment.
Figure 6C:
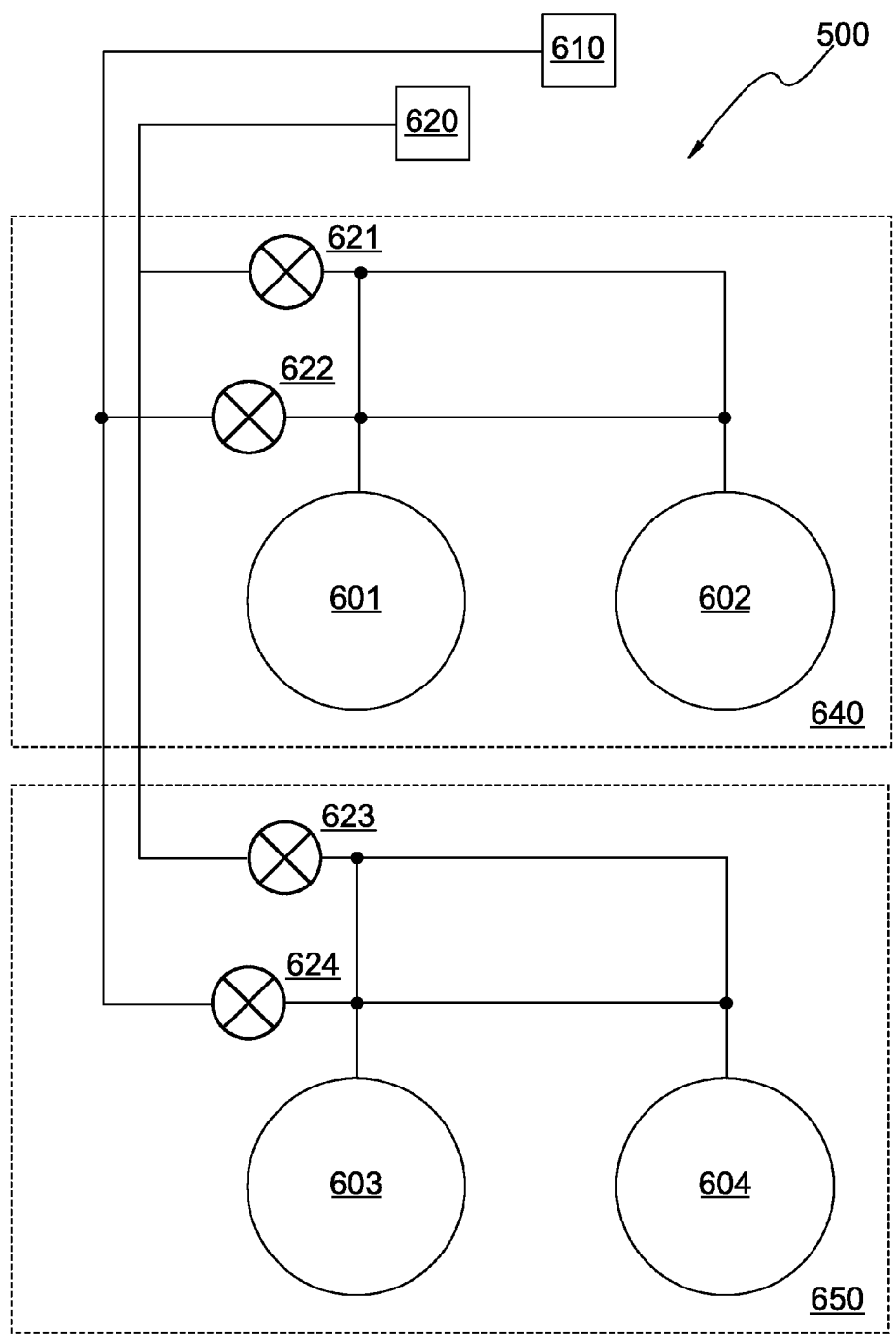
FIG. 6C shows a gripper system using an array of grippers according to another embodiment.

FIGS. 3 and 5 show the operation of a gripper system having a single gripper. While the above embodiments were shown with an individual gripper, other configurations are possible. For illustration, FIGS. 6A-6C shows a gripper system having four grippers. The disclosure is not limited to this configuration, any number of grippers can be utilized in a gripper system. FIG. 6A shows the gripper system 400 where all of the grippers 401, 402, 403, 404 can commonly controlled using controller 450. In other words, first suction system 410 is enabled and disabled to all of the grippers 401-404 simultaneously by actuation of gating element 411. Similarly, second suction system 420 is enabled and disabled to all grippers 401-404 at once by actuation of gating element 421. This may be achieved by using a single gating element, or valve, to control the interface between the grippers 401-404 and each suction system 410, 420. In this embodiment, gating element 411 is used to enable and disable the first suction system 410. This gating element 411 is set to a first position by the controller 450 to allow suction to be created at all four grippers 401-404 so as to pick up the respective items beneath each gripper. Once the four items have been picked up, the controller 450 actuates a second gating element 421, thereby allowing the second suction system 420 to operate on the four grippers 401-404. The first suction system 410 can then be disabled by using the controller to actuate the first gating element 411. Either of the gripper configurations shown in FIG. 3 or 5 may be used in this matrix configuration.

FIG. 6B shows a second gripper system 500 that can be used to control the four grippers 501-504. In this configuration, eight gating elements, two for each gripper 501-504, are utilized. In this way, each gripper 501-504 can be independently controlled. In this way, using a controller (not shown), each gripper 501-504 can be actuated in series, in parallel, or a combination. For example, the operation may begin with all gating elements, or valves, 521-528 closed. Gating element 521 then opens, allowing the first suction system 510 to be in contact with the first gripper 501. When the first gripper 501 picks up its respective item, gating element 522 will be actuated, allowing second suction system 520 to be in communication with the first gripper 501. Gating element 521 can then close. This sequence can then be repeated for each of the grippers 501-504, such that each gripper picks up and retains its respective item before the sequence begins for the next gripper. The use of eight gating elements 521-528 allows added flexibility. For example, the gating elements 521-528 can be sequenced such that the first suction system 510 is simultaneously in communication with two (or more) grippers. Once each gripper has picked up its respective item, the second suction system 520 will be actuated for this set of grippers, which allows the respective items to be held. The gating elements associated with these grippers can then be disabled. The next set of grippers can then be acted upon using the same sequence. In another embodiment, all of the gating elements for the first suction system 510 are actuated simultaneously so that all four grippers 501-504 pick up their respective items at the same time. The gating elements associated with the second suction system 520 are then all actuated, and the gating elements associated with the first suction system 510 are disabled. Thus, the use of two gating elements for each gripper 501-504 allows maximum flexibility in terms of how many grippers 501-504 are actuated at one time. However, this configuration also requires the largest number of gating elements and actuators to implement.

FIG. 6C shows a compromise between the embodiment of FIGS. 6A and 6B, in that the grippers 601-604 are grouped into subsets 640, 650, where each subset 640, 650 is provided with a single gating element, or valve, 622, 624 connecting it to the first suction system 610 and one gating element 621, 623 connecting it to the second suction system 620. In this embodiment, the sequence of actuating the first suction system 610 and the second suction system 620 is as described above. However, more than one gripper is in communication with a set of gating elements. In other words, gating elements 621, 622 are used to simultaneously operate grippers 601, 602, while gating elements 623, 624 operate grippers 603, 604. Although not shown, a controller is used to control the operation of the gating elements, as described above. In this way, the embodiment of FIG. 6C uses fewer gating elements than FIG. 6B but has less flexibility. Conversely, it utilizes more gating elements than the configuration of FIG. 6A but has more flexibility, in that the suction systems 610, 620 can be controlled such that not all of the grippers 601-604 are actuated at once.

Of course, in the embodiments of FIGS. 6A-6C, more or fewer grippers are possible. For example, two grippers or eight grippers may be used.

Figure 7:
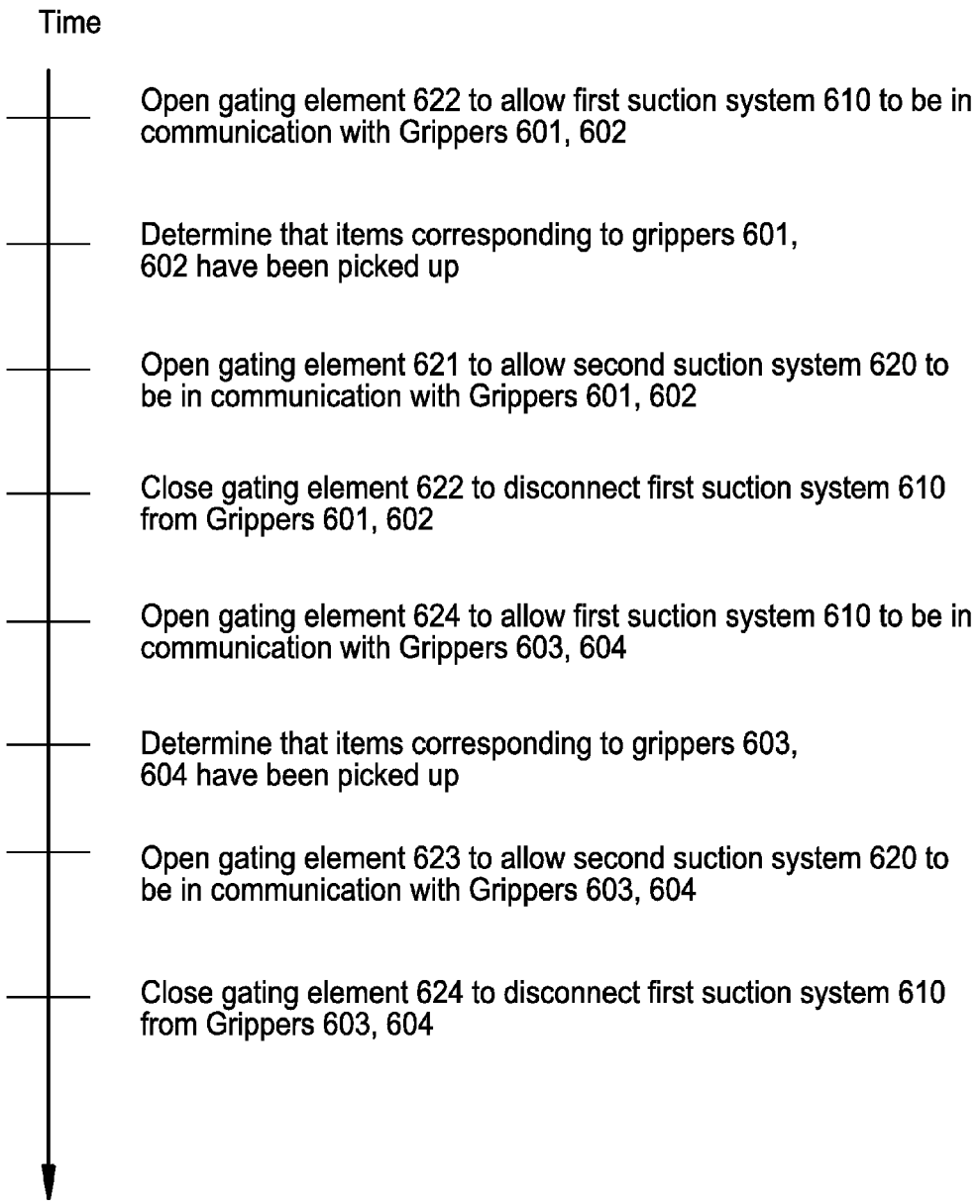
FIG. 7 shows a sequence of operations in accordance with one embodiment.

FIG. 7 shows a timeline showing the sequence of action taken by the controller in order to pick up and hold the items associated with gripper 601-604 of FIG. 6C. The sequence begins with all gating elements, or valves, in the closed position. First, the gating element 622 opens allowing the first suction system to be in communication with grippers 601, 602. As described above, the first suction system can be any suitable system and may be in communication with the grippers 601, 602 using any configuration, including those shown in FIGS. 3 and 5. The controller then determines when the items corresponding to these grippers 601, 602 have been picked up, such as by using a proximity sensor, or simply waiting a predetermined time. In the case of proximity sensors, the controller may wait until the proximity sensors associated with both grippers 601, 602 indicate that the respective item has been picked up. Once the items have been picked up, the controller then actuates gating element 621, allowing the second suction system to be in communication with the grippers 601, 602. After a predetermined time, or concurrent with the actuation of gating element 621, gating element 622 is then closed by the controller, since this suction system is not used to hold the item in place. The controller then repeats this sequence with respect to the second subset 650. When the sequence is completed, gating elements 621 and 623 are open, since second suction system 620 is being used to hold all of the items. Gating elements 622, 624 are both closed as the first suction system 610 is not used to hold items; it is used to pick up items.

The controller described herein may be any suitable processing element, including a dedicated controller, a general purpose controller or a computer. The controller also includes a storage element used to store instructions to be executed by the processing element. The storage element may be any suitable medium including RAM, ROM, FLASH, magnetic or optical memories. Instructions may be stored in this storage element, which enable the controller to execute the sequences described herein. In addition, the controller may have one or more inputs, allowing it to monitor sensors, such as proximity sensor and respond to information received from these sensors.

The configuration shown in FIG. 6C allows large numbers of grippers to be configured into smaller subsets, such that the limits and capabilities of the suction system are not overwhelmed by the presence of a large number of grippers being activated simultaneously. The number of grippers that are grouped into a subset is implementation dependent and may depend on the suction systems being used, the allowable CDA budget and allowable time to pick up all of the associated items and the total number of grippers.

Figure 8:
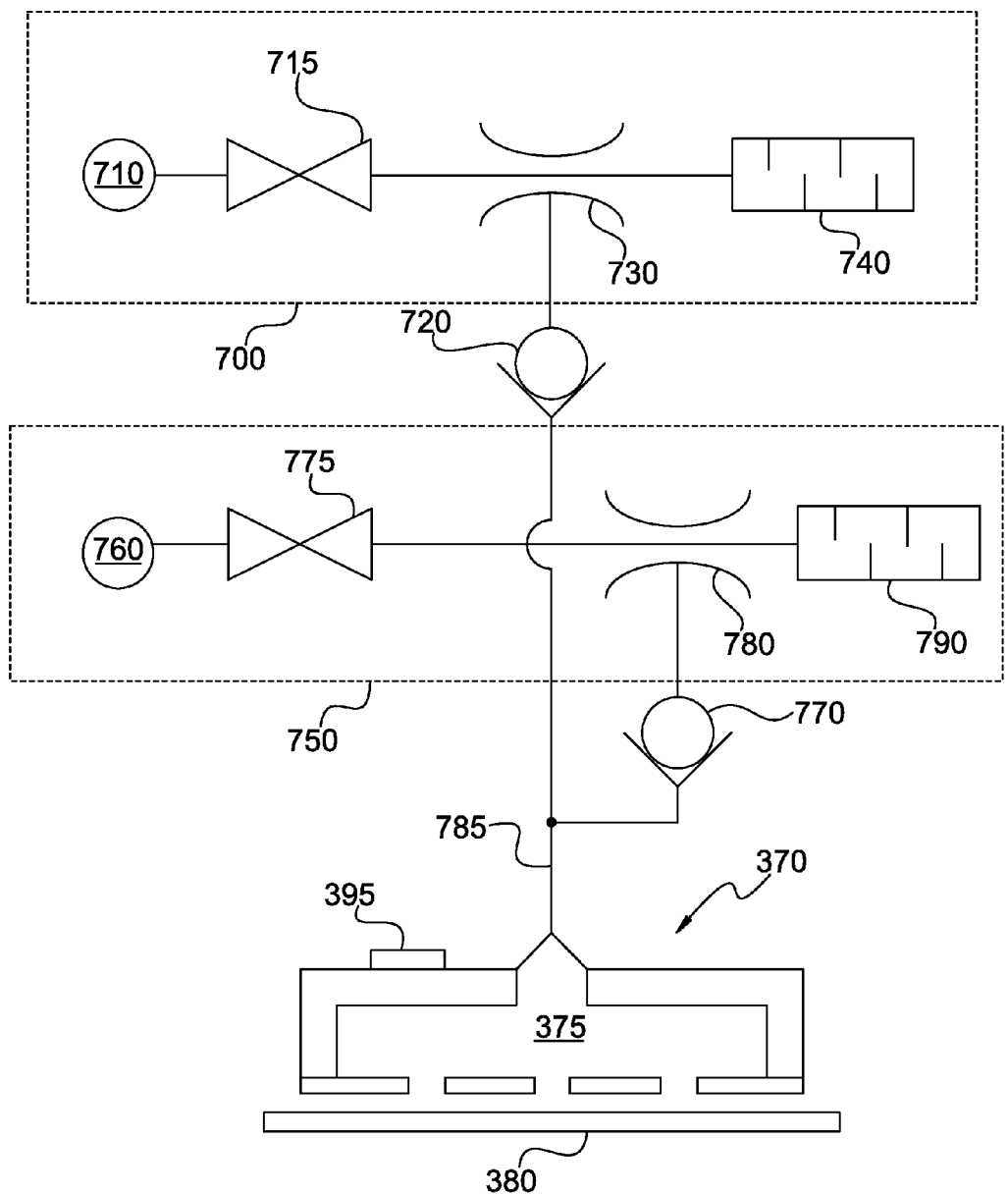
FIG. 8 is a block diagram of a gripper system according to another embodiment.

Furthermore, while the disclosure describes the two suction systems are being a Venturi device based system and a vacuum based system, the disclosure is not limited to this embodiment. For example, in some embodiments, the second suction system used to hold the items may also be a Venturi device based system, where the air flow is lower than that of the first suction system, since the amount of suction required to hold an item is less than the amount required to initially pick up the item. FIG. 8 shows a system having two Venturi device based systems 700, 750. As described above, the first Venturi device based system 700 includes a CDA source 710, and a gating element 715 to allow the flow of compressed air through the Venturi device 730 and out through the muffler 740. The proximal end of the conduit 785 is in communication with the Venturi device 730 while the distal end of the conduit 785 is in communication with a cavity 375 of gripper 370. That cavity 375 is in communication with a second Venturi device based system 750, which also includes a CDA source 760, and a gating element 775 to allow the flow of compressed air through the Venturi device 780 and out through the muffler 790. As with the first system 700, a conduit is used to connect the Venturi device 780 with the cavity 375. To prevent back flow of air, each Venturi device 730, 780 may be connected to the cavity 375 through ball check valves 720, 770.

The flow rate from the CDA source 710 is greater than the flow rate from the CDA source 760. This allows the first system 700 to create the stronger suction needed to pick up an item. The flow rate of the second system 750 is sufficient to hold the previously picked up item.

In operation, the first system 700 is enabled, creating the suction needed to pick up an item. After the item has been picked up, as detected based on time or a proximity sensor, the second system 750 is enabled. As described above, this second system 750 has a lower air flow, and therefore is less costly. After the second system 750 is enabled, the first system 700 can be disabled, through use of gating element 715. Again, all the gating elements may be valves.

In addition, the sequence used to control the various valves shown in the FIG. 7 may be modified from that described herein without departing from the spirit of the invention. For example, gating element 624 may be opened concurrently with the closing of gating element 622.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A gripper system for picking up, holding and placing items, comprising:
   a gripper, adapted to contact said item;
   a first suction system, used to pick up said item, in communication with said gripper, comprising a Venturi device and a source of compressed dry air, having a flow rate;
   a second suction system, used to hold said item after being picked up, in communication with said gripper, wherein said first suction system and said second suction system each create negative pressure between said item and said gripper; and
   a conduit in communication with said Venturi device and said gripper, wherein said second suction system is also in communication with said gripper, and wherein said conduit comprises a ball valve to inhibit the flow of air from said Venturi device to said second suction system when said source of compressed dry air is inactive.

2. The gripper system of claim 1, wherein said second suction system comprises a second Venturi device, and a second source of compressed dry air, having a second flow rate, wherein said second flow rate is less than said flow rate of said first suction system.

3. The gripper system of claim 1, wherein said second suction system comprises a vacuum system.

4. The gripper system of claim 1, further comprising a controller, configured to enable said first suction system to pick up said item.

5. The gripper system of claim 4, wherein said controller enables said second suction system after said item has been picked up by said gripper.

6. The gripper system of claim 5, further comprising a proximity sensor in communication with said controller to determine if said item has been picked up.

7. The gripper system of claim 5, wherein said controller disables said first suction system after said second suction system is enabled.

8. A gripper system for picking up, holding and placing items, comprising:
   a plurality of grippers, each adapted to contact a corresponding item, said plurality of grippers configured into a plurality of subsets;
   a first suction system, used to pick up said items, selectively in communication with each of said plurality of subsets via a first plurality of gating elements;
   a second suction system, used to hold said items after being picked up, selectively in communication with said plurality of subsets via a second plurality of gating elements, wherein said first suction system and said second suction system each create negative pressure between said gripper and said corresponding item; and
   a controller configured to control said gating elements,
   wherein said controller enables a first gating element of a first plurality of gating elements to allow said first suction system to be in communication with a first subset of said grippers,
   wherein said controller enables a first gating element of a second plurality of gating elements to allow said second suction system to be in communication with said first subset of said grippers after items corresponding to said first subset of said grippers have been picked up, and
   wherein said controller disables said first gating element of said first plurality of gating elements after said first gating element of said second plurality of gating elements is enabled.

9. The gripper system of claim 8, wherein each of said plurality of grippers comprises a bottom surface, adapted to contact said item, and said bottom surface comprises two cavities, and wherein said first suction system is in communication with a first cavity and said second suction system is in communication with a second cavity.

10. The gripper system of claim 8, wherein said controller enables a second gating element of a first plurality of gating elements to allow said first suction system to be in communication with a second subset of said grippers, wherein said controller enables a second gating element of a second plurality of gating elements to allow said second suction system to be in communication with said second subset of said grippers after items corresponding to said second subset of grippers have been picked up, and wherein said controller disables said second gating element of said first plurality of gating elements after said second gating element of said second plurality of gating elements is enabled.

11. The gripper system of claim 8, wherein said plurality of grippers is configured into a plurality of subsets, wherein said plurality of subsets is equal to said plurality of grippers.

12. The gripper system of claim 8, wherein said plurality of grippers is configured into a plurality of subsets, wherein said plurality of subsets is less than said plurality of grippers.

13. The gripper system of claim 8, wherein said first suction system comprises a Venturi device, and a source of compressed dry air, having a flow rate.

14. The gripper system of claim 13, wherein said second suction system comprises a second Venturi device, and a second source of compressed dry air, having a second flow rate, wherein said second flow rate is less than said flow rate of said first suction system.

15. The gripper system of claim 13, wherein said second suction system comprises a vacuum system.

16. A gripper system for picking up, holding and placing items, comprising:

a plurality of grippers, each adapted to contact a corresponding item, said plurality of grippers configured into a plurality of subsets;

a first suction system, used to pick up said items, comprising a Venturi device, and a source of compressed dry air, having a flow rate, selectively in communication with each of said plurality of subsets via a first plurality of gating elements;

a second suction system, used to hold said items after being picked up, selectively in communication with said plurality of subsets via a second plurality of gating elements, wherein said first suction system and said second suction system each create negative pressure between said gripper and said corresponding item; and a conduit in communication with said Venturi device and said plurality of grippers, wherein said second suction system is also in communication with said plurality of grippers, and wherein said conduit comprises a ball valve to inhibit the flow of air from said Venturi device to said second suction system when said source of compressed dry air is inactive.

17. The gripper system of claim 16, wherein said second suction system comprises a second Venturi device, and a second source of compressed dry air, having a second flow rate, wherein said second flow rate is less than said flow rate of said first suction system.

18. The gripper system of claim 16, wherein said second suction system comprises a vacuum system.

* * * * *